United States Patent
Yoon et al.

(10) Patent No.: US 8,283,682 B2
(45) Date of Patent: Oct. 9, 2012

(54) LIGHT EMITTING DIODE

(75) Inventors: Yeo Jin Yoon, Ansan-si (KR); Jong Kyu Kim, Ansan-si (KR); Jun Hee Lee, Ansan-si (KR)

(73) Assignee: Seoul Opto Device Co., Ltd., Ansan-si (KR)

(*) Notice: Subject to any disclaimer, the term of this patent is extended or adjusted under 35 U.S.C. 154(b) by 0 days.

(21) Appl. No.: 13/111,406

(22) Filed: May 19, 2011

(65) Prior Publication Data
US 2011/0215346 A1 Sep. 8, 2011

Related U.S. Application Data

(63) Continuation of application No. 12/050,873, filed on Mar. 18, 2008.

(30) Foreign Application Priority Data

Mar. 19, 2007 (KR) .................. 10-2007-0026697

(51) Int. Cl.
*H01L 29/20* (2006.01)
(52) U.S. Cl. ............. 257/92; 257/97; 257/E25.032; 257/E21.381; 315/200 A
(58) Field of Classification Search ............. 257/2, 12, 257/13, 79, 81, 82, 88, 91, 92, 97, 99, E25.032, 257/E21.381; 315/200 A, 322, 326
See application file for complete search history.

(56) References Cited

U.S. PATENT DOCUMENTS

| 2005/0224822 | A1* | 10/2005 | Liu | 257/84 |
| 2005/0253151 | A1* | 11/2005 | Sakai et al. | 257/79 |
| 2007/0131958 | A1* | 6/2007 | Hsu et al. | 257/99 |

FOREIGN PATENT DOCUMENTS

| JP | 2004-006582 | 1/2004 |
| JP | 2006-073815 | 3/2006 |
| WO | 2006/080609 | 8/2006 |

* cited by examiner

*Primary Examiner* — Olik Chaudhuri
*Assistant Examiner* — Su Kim
(74) *Attorney, Agent, or Firm* — H.C. Park & Associates, PLC

(57) ABSTRACT

The present invention comprises a substrate, and at least one serial array having a plurality of light emitting cells connected in series on the substrate. Each of the light emitting cells comprises a lower semiconductor layer, an upper semiconductor layer, an active layer interposed between the lower and upper semiconductor layers, a lower electrode formed on the lower semiconductor layer exposed at a first corner of the substrate, an upper electrode layer formed on the upper semiconductor layer, and an upper electrode pad formed on the upper electrode layer exposed at a second corner of the substrate. The upper electrode pad and the lower electrode are respectively disposed at the corners diagonally opposite to each other, and are symmetric with respect to those of adjacent another of the light emitting cells.

9 Claims, 5 Drawing Sheets

LIGHT EMITTING DIODE

CROSS REFERENCE RELATED APPLICATIONS

This application is a continuation of U.S. patent application Ser. No. 12/050,873, filed on Mar. 18, 2008 and claims priority of Korean Application NO. 10-2007-0026697, filed Mar. 19, 2007, the contents of which are incorporated herein by reference in their entirety.

FIELD OF THE INVENTION

The present invention relates to a light emitting diode, and more particularly, to a light emitting diode, wherein a region of the light emitting diode occupied by an upper electrode pad and a lower electrode is designed to be small to thereby reduce a region where light emitted from the light emitting diode is blocked by the upper electrode pad and the lower electrode and secure a larger light emitting area, thereby improving light emission efficiency.

BACKGROUND OF THE INVENTION

GaN-based light emitting diodes (LEDs) have been employed and developed for about 10 years or more. The GaN-based LEDs considerably have changed LED technologies and are currently used for various applications, such as full-color LED display devices, LED traffic lights and white LEDs. Recently, it has been expected that high-efficiency white LEDs will substitute for fluorescent lamps. Particularly, the efficiency of the white LEDs has reached the level similar to that of typical fluorescent lamps.

In general, an LED emits light by forward current and requires the supply of DC. Hence, if the LED is connected directly to an AC power source, it is repeatedly turned on/off depending on the direction of current. As a result, there are problems in that the LED does not continuously emit light and is easily broken by reverse current.

To solve such a problem, an LED capable of being connected directly to a high-voltage AC power source is disclosed in PCT Patent Publication No. WO 2004/023568(A1), entitled "LIGHT-EMITTING DEVICE HAVING LIGHT-EMITTING ELEMENTS" by SAKAI et al.

According to PCT Patent Publication No. WO 2004/023568(A1), LEDs (i.e., light emitting cells) are two-dimensionally connected in series on a single insulative substrate such as a sapphire substrate to form LED arrays. Such two LED arrays are connected to each other in reverse parallel on the sapphire substrate.

A GaN-based LED is generally formed by growing epitaxial layers on a substrate such as sapphire and comprises an N-type semiconductor layer, a P-type semiconductor layer and an active layer interposed therebetween. Meanwhile, an N-type electrode is formed on the N-type semiconductor layer, and a P-type electrode is formed on the P-type semiconductor layer. The LED is electrically connected to an external power source through the electrodes, thereby being driven. At this time, a current flows from the P-type electrode into the N-type electrode via the semiconductor layers.

Since the P-type semiconductor layer generally has high specific resistivity, there is a problem in that the current cannot be uniformly distributed but is concentrated on a portion at which the P-type electrode is formed. The current concentration leads to the reduction of a light emitting area, and therefore, the light emission efficiency is lowered. In order to solve such a problem, the technology for distributing current by forming a transparent electrode layer with a low specific resistivity on a P-type semiconductor layer is used. Since the current introduced from the P-type electrode is distributed in the transparent electrode layer and flows into the P-type semiconductor layer, the light emitting area of the LED can be expanded.

However, since the transparent electrode layer absorbs light, the thickness of the transparent electrode is restricted, and therefore, there is a limit in the current distribution. Particularly, a large-sized LED having an area of about 1 mm$^2$ or more used for high power has a limit in the current distribution using the transparent electrode layer.

Meanwhile, the current flows through semiconductor layers and exits through the N-type electrode. Thus, the current is concentrated on a portion of the N-type semiconductor layer on which the N-type electrode is formed, which means that the current flowing in the semiconductor layers is concentrated near the portion on which the N-type electrode is formed. Therefore, it is required to develop an LED capable of improving current concentration in an N-type semiconductor layer.

In the meantime, P-type and N-type electrodes formed in an LED generally block light emitted from the LED. Therefore, it is necessary to improve the structure of the P-type and N-type electrodes, which can enhance the light emission efficiency of the LED.

An object of the present invention is to provide an AC LED having an electrode structure in which a current flowing in operation of the LED can be uniformly distributed and the light efficiency can be enhanced.

According to an aspect of the present invention for achieving the objects, there is provided an AC LED, which comprises a substrate, and at least one serial array having a plurality of light emitting cells connected in series on the substrate. Each of the light emitting cells comprises a lower semiconductor layer consisting of a first conductive compound semiconductor layer formed on top of the substrate, an upper semiconductor layer consisting of a second conductive compound semiconductor layer formed on top of the lower semiconductor layer, an active layer interposed between the lower and upper semiconductor layers, a lower electrode formed on the lower semiconductor layer exposed at a first corner of the substrate, an upper electrode layer formed on the upper semiconductor layer, and an upper electrode pad formed on the upper electrode layer exposed at a second corner of the substrate. The upper electrode pad and the lower electrode are respectively disposed at the corners diagonally opposite to each other; and the respective light emitting cells are arranged so that the upper electrode pad and the lower electrode of one of the light emitting cells are symmetric with respect to those of adjacent another of the light emitting cells.

The serial array may comprise two serial arrays connected in reverse parallel to each other.

The two serial arrays connected in reverse parallel to each other, at least one of the light emitting cells positioned in any one of the serial arrays is electrically connected to the corresponding one of the light emitting cells positioned in the other serial array. Accordingly, it is possible to prevent overvoltage caused by a reverse voltage from being applied to a specific serial array during the operation of the AC LED.

The upper electrode layer may be a transparent electrode layer.

The transparent electrode layer may be formed of indium tin oxide (ITO) or Ni/Au.

The upper electrode pad may be formed of at least one selected from Ni, Cr, Pd, Pt, W and Al.

The upper electrode pad may comprise at least one layer or alloy layer.

The lower electrode may be formed of at least one selected from Ni, Cr, Pd, Pt, W and Al.

The lower electrode may comprise at least one layer or alloy layer.

The active layer may include a single quantum well or multiple quantum well structure having an $In_xGa_{1-x}N$ ($0<x<1$) well layer and an $In_xGa_{1-x}N$ ($0\leq x<1$) barrier layer.

The $In_xGa_{1-x}N$ ($0<x<1$) well layer may have more In content than the $In_xGa_{1-x}N$ ($0\leq x<1$) barrier layer.

The second conductive compound semiconductor layer may include $Al_xGa_{1-x}N$ ($0\leq x<1$).

According to another aspect of the present invention, there is provided an AC LED, which comprises: two or more single chips electrically connected in series. Each of the single chips comprises a substrate, and at least one serial array having a plurality of light emitting cells connected in series on the substrate. Each of the light emitting cells comprises a lower semiconductor layer consisting of a first conductive compound semiconductor layer formed on top of the substrate, an upper semiconductor layer consisting of a second conductive compound semiconductor layer formed on top of the lower semiconductor layer, an active layer interposed between the lower and upper semiconductor layers, a lower electrode formed on the lower semiconductor layer exposed at a first corner of the substrate, an upper electrode layer formed on the upper semiconductor layer, and an upper electrode pad formed on the upper electrode layer exposed at a second corner of the substrate. The upper electrode pad and the lower electrode are respectively disposed at the corners diagonally opposite to each other; and the respective light emitting cells are arranged so that the upper electrode pad and the lower electrode of one of the light emitting cells are symmetric with respect to those of adjacent another of the light emitting cells.

The serial array may comprise two serial arrays connected in reverse parallel to each other.

The two or more single chips may be mounted on respective packages and are connected in series by a bonding wire.

The two or more single chips may be mounted on respective packages, and the packages are connected in series.

DETAILED DESCRIPTION OF THE INVENTION

Figure 1:
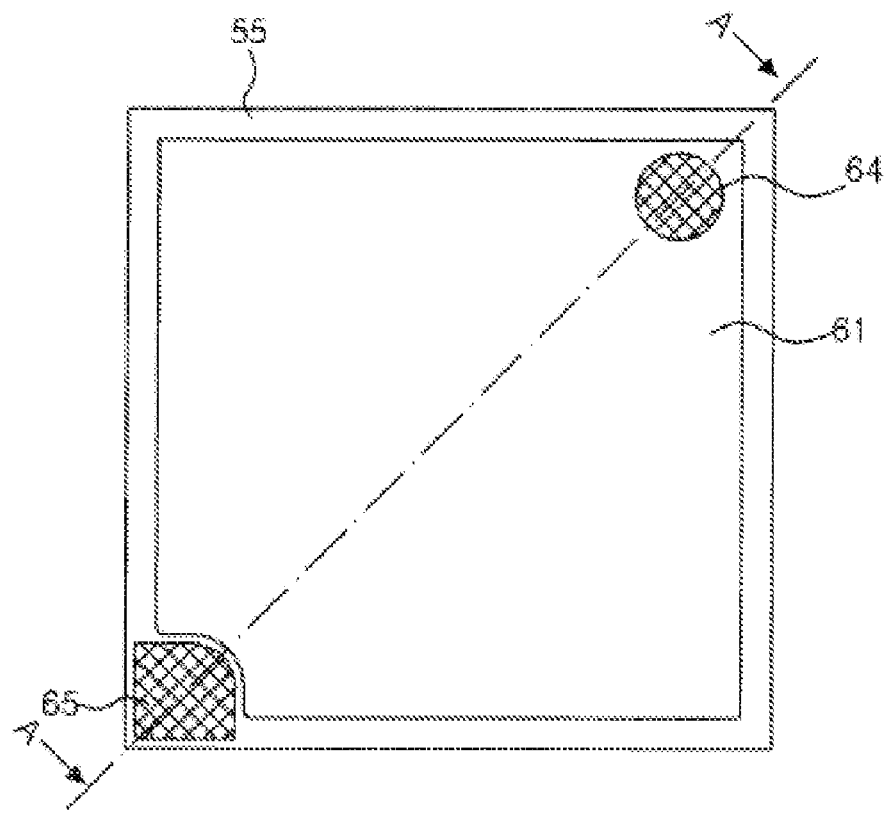
FIG. 1 is a plan view illustrating an LED having a single light emitting cell with an electrode structure according to one embodiment of the present invention.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 2:
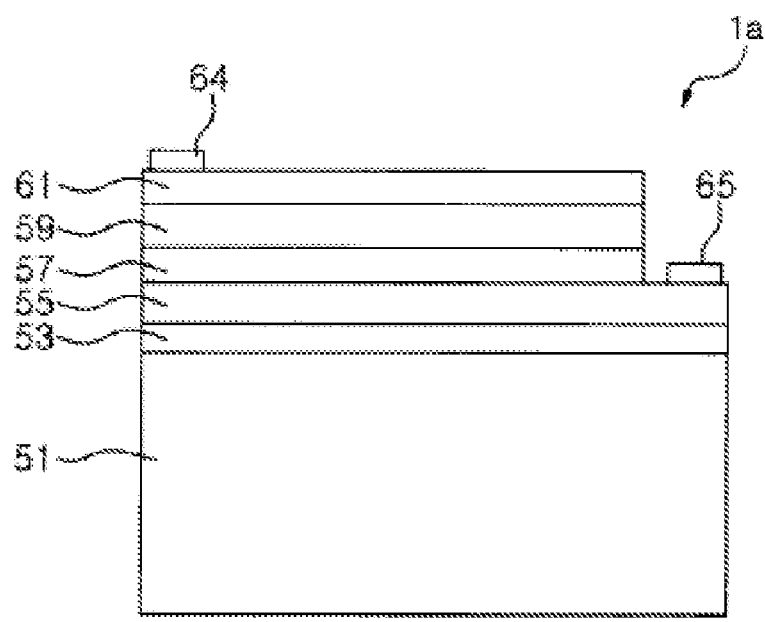
FIG. 2 is a sectional view taken along line A-A of FIG. 1.

FIG. 1 is a plan view illustrating an LED having a single light emitting cell with an electrode structure according to one embodiment of the present invention, and FIG. 2 is a sectional view taken along line A-A of FIG. 1. The technical structures and characteristics, which are used in describing the LED having a single light emitting cell with an electrode structure according to the embodiment of the present invention illustrated in FIGS. 1 and 2, will be adaptively used in the following various embodiments related to FIGS. 3 to 9 so long as there is no additional description.

Referring to FIGS. 1 and 2, the LED 1a having a single light emitting cell with an electrode structure according to the embodiment of the present invention has a first conductive lower semiconductor layer 55, an active layer 57 and a second conductive upper semiconductor layer 59, which are formed on a substrate 51. In the following drawings, the LED 1a will be adaptively shown as a light emitting cell 1 without departing from the fundamental spirit of the invention.

The active layer 57 may have a single or multiple quantum well structure including a well layer and a barrier layer, and the substance and composition thereof is selected depending on a required light emission wavelength. For example, the active layer 57 may be formed of a GaN-based compound semiconductor. Alternatively, the active layer 57 may have, for example, an $In_xGa_{1-x}N$ ($0<x<1$) well layer and an $In_xGa_{1-x}N$ ($0\leq.x<1$) barrier layer. The $In_xGa_{1-x}N$ ($0<x<1$) well layer may be formed to have more In content than the $In_xGa_{1-x}N$ ($0\leq.x<1$) barrier layer.

In the meantime, the lower and upper semiconductor layers 55 and 59 are formed of a material with a greater band gap than the active layer 57 and may be formed of a GaN-based compound semiconductor. For example, a second conductive compound semiconductor layer constituting the lower semiconductor layer 55 may include $In_xGa_{1-x}N$ ($0\leq.x<1$).

Meanwhile, a buffer layer 53 may be interposed between the lower semiconductor layer 55 and the substrate 51. The buffer layer 53 is employed to reduce mismatch between the substrate 51 and the lower semiconductor layer 55.

As shown in FIG. 2, the upper semiconductor layer 59 is positioned on a partial region of the lower semiconductor layer 55, and the active layer 57 is interposed between the upper and lower semiconductor layers 59 and 55. In addition, an upper electrode layer 61 may be positioned on the upper semiconductor layer 59. The upper electrode layer 61 that is a transparent electrode layer may be formed, for example, of a material such as indium tin oxide (ITO) or Ni/Au.

Meanwhile, a lower electrode 65 is positioned on the lower semiconductor layer 55 exposed at a first corner (a bottom left corner of FIG. 1) of the substrate 51. The upper electrode layer 61 is formed on the upper semiconductor layer 59, and an upper electrode pad 64 is positioned on the upper electrode layer 61 at a second corner (a top right corner of FIG. 1) of the substrate 51. The upper electrode pad 64 may be formed of at least one selected from Ni, Cr, Pd, Pt, W and Al using a lift-off technique. The upper electrode pad 64 may include at least one layer or alloy layer.

When the lower semiconductor layer 55 is of an N type, the lower electrode 65 may be formed of Ti/Al using a lift-off technique. Besides, the lower electrode 65 may be formed of at least one selected from Ni, Cr, Pd, Pt, W and Al, and may include at least one layer or alloy layer.

The upper electrode layer 61 that is a transparent electrode layer is formed, for example, of ITO or Ni/Au to have transparency and is in ohmic contact with the upper semiconductor layer 59 to lower contact resistance. However, the upper electrode pad 64 does not have transparency and is not in ohmic contact with the upper semiconductor layer 59. As the upper electrode layer 61 is formed between the upper electrode pad 64 and the upper semiconductor layer 59, it is possible to prevent current from being concentrated under the upper electrode pad 64 and to prevent light from being absorbed and lost by the upper electrode pad 64.

In addition, the upper electrode pad 64 with a relatively small area is formed at a corner of the upper semiconductor layer 59, thereby improving current distribution in the upper semiconductor layer 59.

Moreover, the upper electrode pad 64 and the lower electrode 65 are disposed at corners of the substrate 51 opposite to each other, respectively. Accordingly, the current supplied through the upper electrode pad 64 can be uniformly distributed in the upper electrode layer 61.

Figure 3:
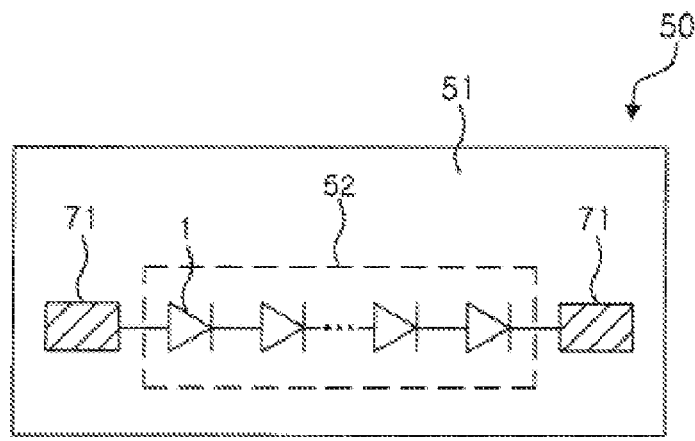
FIG. 3 is a schematic view illustrating an LED having a serial array of the light emitting cells shown in FIG. 1 according to embodiments of the present invention.

FIG. 3 is a schematic view illustrating an LED having a serial array of the light emitting cells shown in FIG. 1 according to embodiments of the present invention. The serial array is disposed in a single chip 50.

Referring to FIG. 3, the single chip 50 has a substrate 51. The substrate 51 may be insulative substrate or a conductive substrate having an insulating layer formed on a top surface thereof. A plurality of light emitting cells 1 are disposed on the substrate 51. The light emitting cells are connected in series to one another by wires to form a serial array 52. Bonding pads 71 may be positioned at both ends of the serial array 52. The bonding pads 71 are electrically connected to both the ends of the serial array 52, respectively.

In the embodiments of the present invention, the light emitting cells in the single chip 50 may be all connected in series on the single substrate. Thus, the processes of forming the light emitting cells 1 on a single substrate and forming wires for connecting the light emitting cells 1 are simplified.

Figure 4:
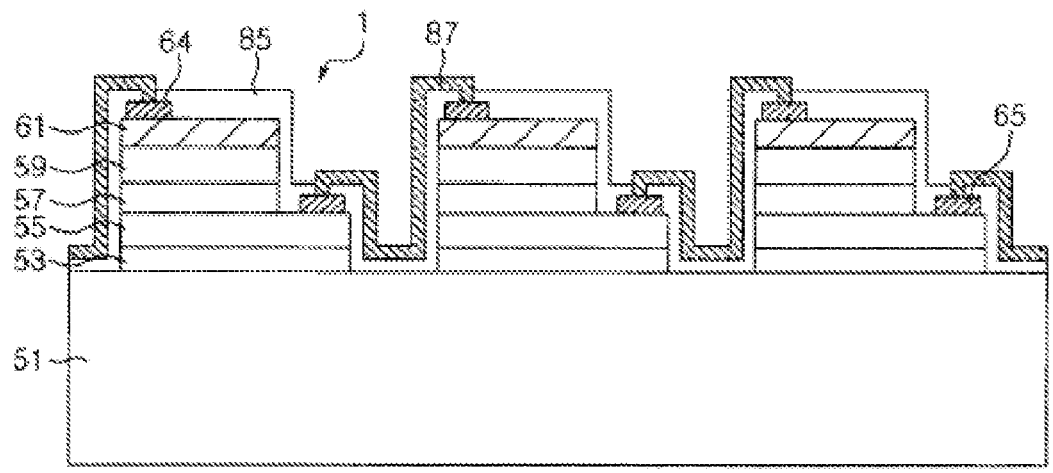
FIG. 4 is a partial sectional view illustrating light emitting cells used in embodiments of the present invention.

FIG. 4 is a partial sectional view illustrating light emitting cells used in embodiments of the present invention, in which the light emitting cells are connected in series through wires formed by a step cover process. However, the light emitting cells may be connected in series through wires formed by an air bridge process as well as the step cover process. Referring to FIG. 3, a plurality of the light emitting cells 1 are spaced apart from one another on a substrate 51. Each of the light emitting cells 1 comprises a lower semiconductor layer 55 consisting of a first conductive compound semiconductor layer, an active layer 57 and an upper semiconductor layer 59 consisting of a second conductive compound semiconductor layer. The active layer 57 may have a single or multiple quantum well structure including a well layer and a barrier layer, wherein the substance and composition of the active layer 57 is selected depending on a required light emission wavelength. For example, the active layer 57 may be formed of a GaN-based compound semiconductor. The lower and upper semiconductor layers 55 and 59 may be formed of a material with a greater band gap than the active layer 57 and formed of a GaN-based compound semiconductor.

Meanwhile, a buffer layer 53 may be interposed between the lower semiconductor layer 55 and the substrate 51. The buffer layer 53 is employed to reduce mismatch between the substrate 51 and the lower semiconductor layer 55. As shown in the figure, the buffer layer 53 may be formed to have portions spaced apart from each other, but the present invention is not limited thereto. If the buffer layer 53 is formed of an insulative material or a material with large resistance, the buffer layer 53 may be formed continuously over the substrate 51.

As shown in this figure, the upper semiconductor layer 59 is positioned on a partial region of the lower semiconductor layer 55, and the active layer 57 is interposed between the upper and lower semiconductor layers 59 and 55. In addition, an upper electrode layer 61 may be positioned on the upper semiconductor layer 59. The upper electrode layer 61 that is a transparent electrode layer may be formed, for example, of a material such as indium tin oxide (ITO) or Ni/Au.

Meanwhile, the light emitting cells 1 are electrically connected through wires 87. The lower semiconductor layer 55 of one of the light emitting cells is connected to the upper electrode layer 61 of adjacent another of the light emitting cells by the wire 87. As shown in this figure, upper electrode pads 64 formed on the upper electrode layer 61 may be connected to lower electrodes 65 formed on exposed regions of the lower semiconductor layer 55 through the wires 87, respectively.

The wires 87 for connecting the light emitting cells 1 may be formed by a step cover process. That is, all the layers of the light emitting cells 1 and the substrate 51 are covered with an insulating layer 85, except portions for contacting the wires 87. Then, the wires 87 are patterned on the insulating layer 85, so that the light emitting cells 1 are electrically connected to one another.

For example, the insulating layer 85 has openings for exposing the upper electrode pads 64 and the lower electrodes 65. The wires 87 connect the upper electrode pads 64 and the lower electrodes 65 of the light emitting cells adjacent to each other through the openings, whereby the light emitting cells are connected in series. Thus, the serial array 52 (see FIG. 3) is formed, in which the light emitting cells are connected in series by the wires 87 on the single substrate 51.

As described above, an AC LED using a single chip having a serial array on a substrate has been described. However, an AC light emitting device may be configured using single chips, each of which has a serial array, connected in reverse parallel on a substrate.

Figure 5:
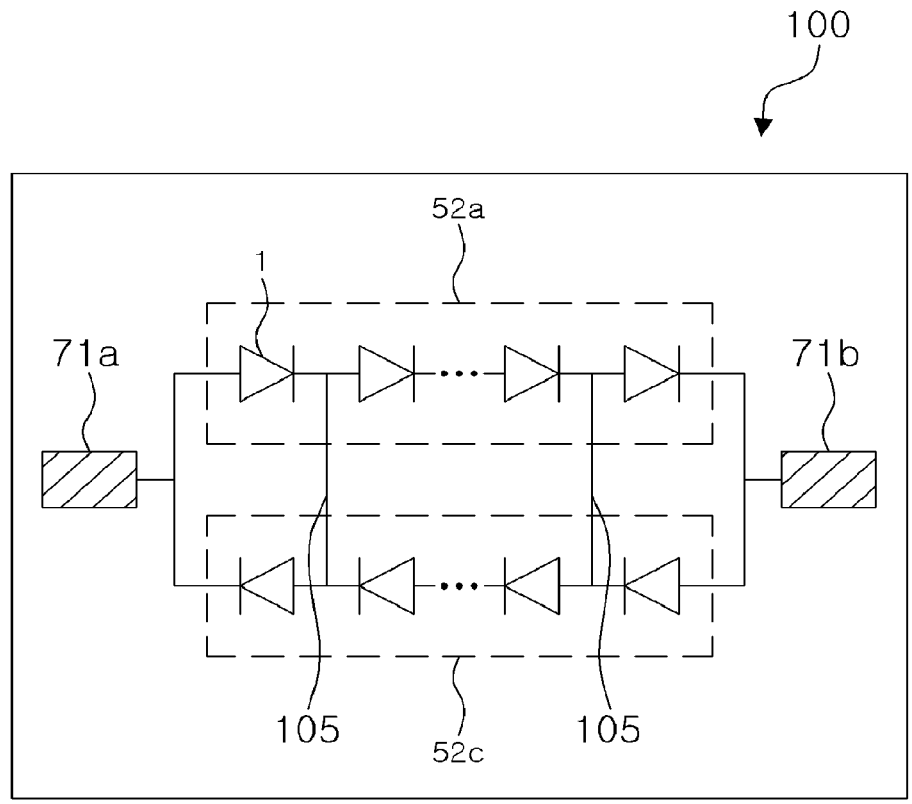
FIG. 5 is a schematic view illustrating serial arrays of light emitting cells according to other embodiments of the present invention.

FIG. 5 is a schematic view illustrating an AC LED using a single chip 100 having serial arrays connected in reverse parallel on a single substrate.

Referring to FIG. 5, two serial arrays 52a and 52c, each of which has light emitting cells 1 connected in series, are disposed on a substrate 51. The serial arrays 52a and 52c are connected in reverse parallel to each other between bonding pads 71a and 71b.

When such single chips 100 are connected in series to each other by a connecting means (not shown), at least two array groups may be formed. The connecting means may be a bonding wire for directly connecting bonding pads. That is, single chips are mounted on respective packages, and the single chips mounted on the respective packages are connected to one another by bonding wires, thereby forming several array groups. Alternatively, as described above, the single chips 100 are mounted on respective packages, and the respective packages are connected in series, thereby forming several array groups. Besides, serial array groups may be variously formed using single chips and packages.

Meanwhile, the corresponding light emitting cells 1 in the respective serial arrays 52a and 52c formed on the same substrate 51 are electrically connected by connecting means 105. That is, in the two serial arrays 52a and 52c connected in reverse parallel to each other, at least one light emitting cell positioned in any one of the serial arrays is electrically connected to at least one corresponding light emitting cell positioned in the other of the serial arrays by the connecting means 105. The connecting means 105 prevents overvoltage from being applied to light emitting cells in a serial array to which the reverse voltage is applied. The connecting means 105 may connect first conductive lower semiconductor layers, each of which is commonly used by adjacent ones of the light emitting cells 1 in each of the serial arrays 52a and 52c, to one another. Alternatively, the connecting means 105 may connect wires formed to connect adjacent ones of the light emitting cells 1 in the respective serial arrays 52a and 52c to one another in series.

According to this embodiment, several single chips 100, in each of which the serial arrays 52a and 52c each having light emitting cells serially connected are connected in reverse parallel to one another, are connected in series to form several array groups, thereby decreasing the number of light emitting cells in a serial array on a single substrate.

Figure 6:
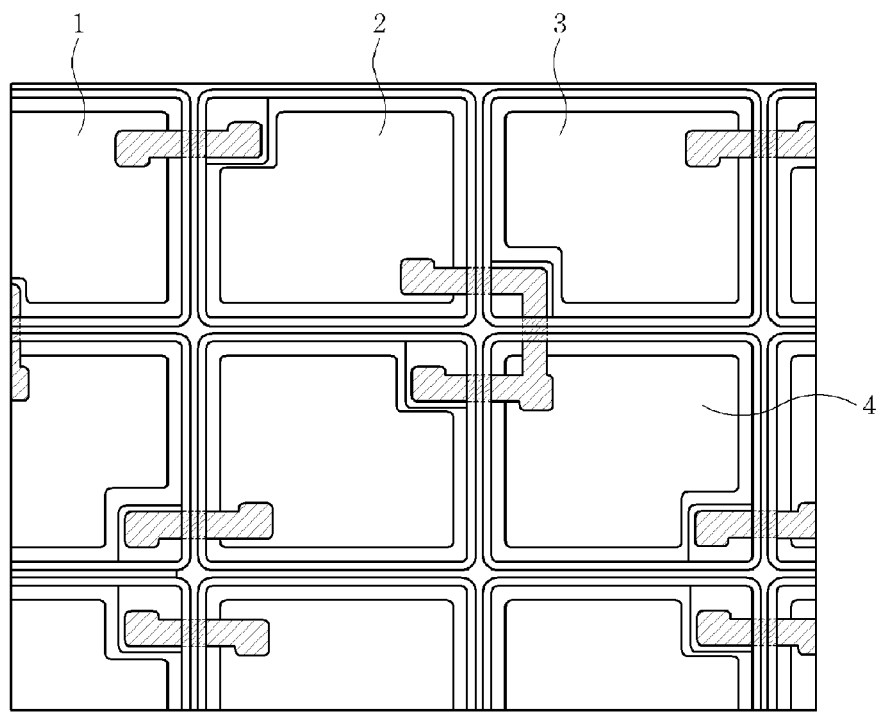
FIG. 6 is a photograph showing an electrode structure of an LED according to one embodiment of the present invention.

FIG. 6 is a photograph showing an electrode structure of an LED according to one embodiment of the present invention.

Referring to FIG. 6, several light emitting cells are disposed in an array on a substrate. The respective light emitting cells are electrically connected to one another by connecting means by a step cover process.

It can be seen that an upper electrode pad and a lower electrode, which are provided in each light emitting cell, are respectively disposed at corners opposite to each other. A percentage of the area occupied by the upper electrode pad and the lower electrode in each light emitting cell is relatively small. In addition, such a configuration in one of the light emitting cells is disposed symmetrically with respect to adjacent another of the light emitting cells. That is, the upper electrode pad and the lower electrode in each light emitting cell are diagonally disposed at corners, respectively. The upper electrode pad and the lower electrode of one of the light emitting cells are arranged to be symmetric with respect to those of adjacent another of the light emitting cells.

As the upper electrode pad and the lower electrode provided in each light emitting cell are respectively disposed at corners opposite to each other, the respective light emitting cells can be disposed so that the length of a connecting means is minimized when two of the light emitting cells are electrically connected to each other.

For example, first, second and third light emitting cells 1, 2 and 3 are arranged in a line. At this time, the first light emitting cell 1 has a lower electrode disposed a left bottom corner and an upper electrode pad disposed at a right top corner. Further, the second light emitting cell 2 has a lower electrode disposed a left top corner and an upper electrode pad disposed at a right bottom corner. Furthermore, the third light emitting cell 3 has a lower electrode disposed a left bottom corner and an upper electrode pad disposed at a right top corner.

Moreover, a fourth light emitting cell 4 has an upper electrode pad disposed at a left top corner and a lower electrode disposed at a right bottom corner. The third and fourth light emitting cells 3 and 4 are connected to each other by a connecting means.

As described above, the upper electrode pad and the lower electrode are respectively disposed at corners opposite to each other in each light emitting cell, thereby simplifying processes and enhancing reliability when fabricating an AC LED.

In addition, the upper electrode pad and the lower electrode respectively disposed at corners opposite to each other in each light emitting cell are small in size, whereby an area, in which light emitted from the LED is blocked by the upper electrode pads and the lower electrodes, is small, and a light emitting area is large.

Figure 7:
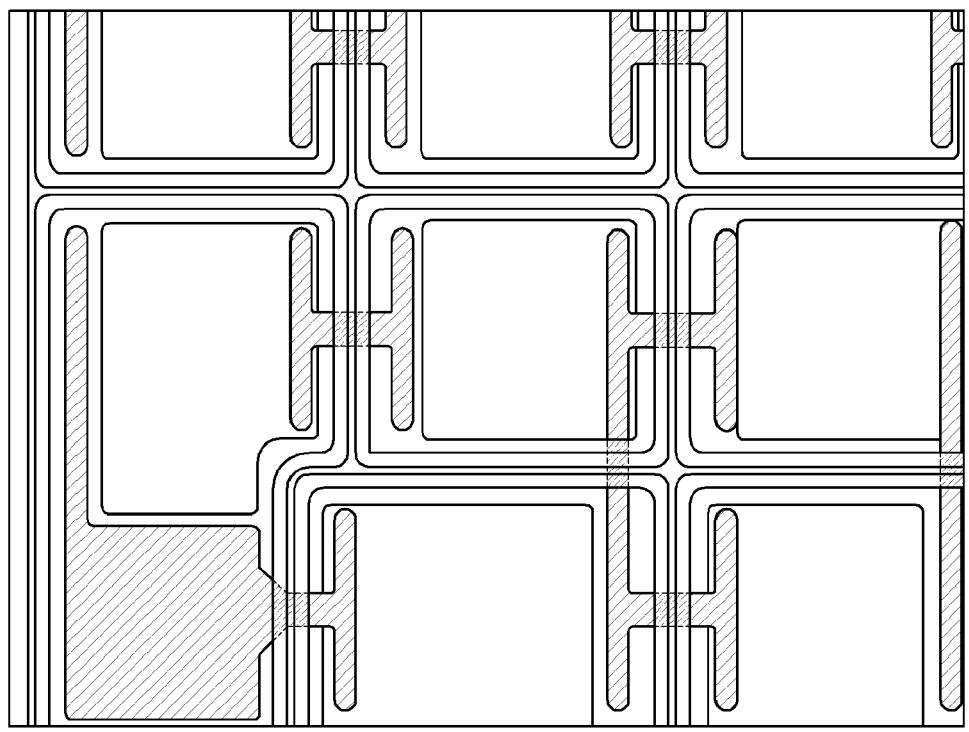
FIG. 7 is a photograph showing an electrode structure of an LED according to a comparative example to be compared with the electrode structure of the LED according to the embodiment of the present invention.

FIG. 7 is a photograph showing an electrode structure of an LED according to a comparative example to be compared with the electrode structure of the LED according to the embodiment of the present invention.

Referring to FIG. 7, an upper electrode pad and a lower electrode are respectively formed to extend at edges of both opposite sides in each light emitting cell disposed in the LED according to the comparative example. It can be seen that a percentage of the area occupied by the upper electrode pad and the lower electrode in each light emitting cell is considerably larger than that of FIG. 6. Thus, it can be seen that as the area occupied by an upper electrode pad, a lower electrode and a wire is wide, the light emitting area is decreased.

Figure 8:
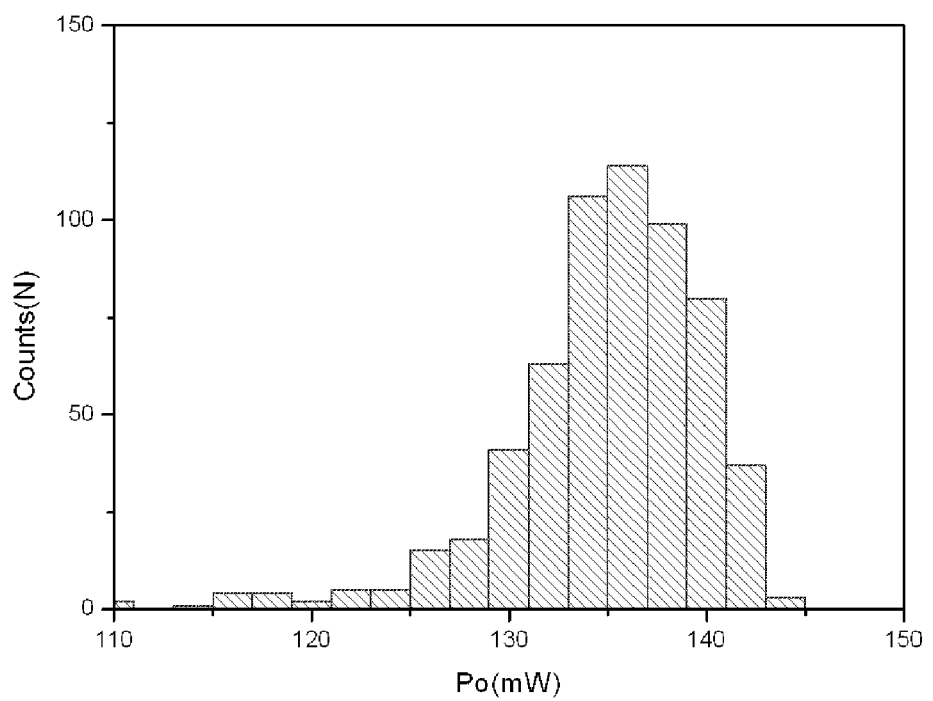
FIG. 8 is a graph showing the light emission efficiency of the LED according to the embodiment of the present invention.
Figure 9:
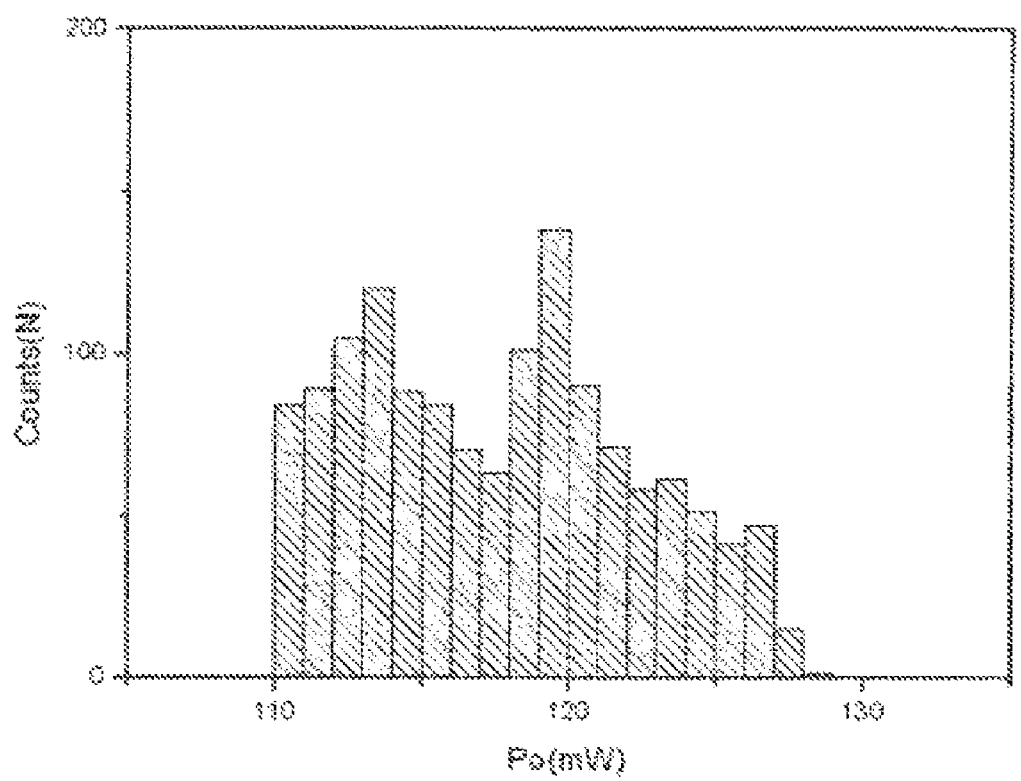
FIG. 9 is a graph showing the light emission efficiency of the LED according to the comparative example.

FIG. 8 is a graph showing the light emission efficiency of the LED according to the embodiment of the present invention, and FIG. 9 is a graph showing the light emission efficiency of the LED according to the comparative example.

That is, FIG. 8 shows the optical power outputted from each light emitting cell provided in the LED shown in FIG. 6 according to the embodiment of the present invention, in which the number of light emitting cells for every optical power value is shown.

FIG. 9 shows the optical power outputted from each light emitting cell provided in the LED shown in FIG. 7 according to the comparative example, in which the number of light emitting cells for every optical power value is shown. At this time, the light emitting cells shown in FIGS. 6 and 7 have the same size.

Referring to FIG. 8, the optical power of each light emitting cell provided in the LED according to the embodiment of the present invention is measured as 135 mW on the average. Referring to FIG. 9, the optical power of each light emitting cell provided in the LED according to the comparative example is measured as 119 mW on the average.

Through the comparison results, it can be seen that the light emission efficiency of the LED according to the embodiment of the present invention is superior to that of the LED according to the comparative example.

According to the present invention, a region occupied by an upper electrode pad and a lower electrode is designed to be small, so that a region in which light emitted from the LED is blocked by the upper electrode pads and the lower electrodes is reduced and a light emitting area is large, thereby improving the light emission efficiency.

Further, an upper electrode pad and a lower electrode in an LED are respectively disposed at corners opposite to each other, thereby maximizing current distribution.

Furthermore, an upper electrode pad and a lower electrode of each light emitting cell are respectively disposed at corners even when light emitting cells are electrically connected in order to stably operate an AC LED. This, a connection circuit can be configured to have the shortest path between the upper electrode pad of one of the light emitting cells and the lower electrode of adjacent another of the light emitting cells, thereby simplifying a process of fabricating the AC LED and enhancing reliability.

The present invention described above is not defined by the aforementioned embodiments, but various modifications and changes can be made thereto by those skilled in the art and are included in the spirit and scope of the invention defined by the appended claims.

For example, various structures of serial arrays having serially connected light emitting cells have been described in FIGS. 3 to 5. However, although not shown in the respective figures, each light emitting cell 1 included in each serial array has an electrode structure described in detail in connection with FIGS. 6 to 9. That is, an upper electrode pad and a lower electrode, which are formed in each light emitting cell 1, are respectively disposed at corners diagonally opposite to each other, and the respective light emitting cells 1 are arranged so that the upper electrode pad and the lower electrode in one of the light emitting cells are symmetric with respect to those in adjacent another of the light emitting cells. The advantages of such an electrode structure have been fully described in connection with FIGS. 6 to 9.

What is claimed is:

1. A light emitting diode (LED) comprising:
    a substrate; and
    at least three light emitting cells on the substrate,
    wherein each of the light emitting cells comprises a first semiconductor layer,
    a second semiconductor layer disposed on the first conductive semiconductor layer,
    a first electrode formed on an exposed portion of the first semiconductor layer, and a second electrode formed on the second semiconductor layer,
    wherein first connecting elements are configured to connect at least two of the at least three light emitting cells in series, wherein at least one of the at least three light emitting cells are configured to connect the at least two of the at least three light emitting cells in parallel,
    at least one second connecting elements are configured to connect the at least two of the at least three light emitting cells to the at least one of the at least three light emitting cells to operate in response to a forward voltage to the at least one of the at least three light emitting cells which configured to operate in response to a reverse voltage, wherein an overvoltage is prevented from being applied to the at least two or the at least one of the at least three light emitting cell in a light emitting cell array group to which the reverse voltage is applied, by the second connecting elements, during an operation by the forward voltage, and
    wherein the second electrode and the first electrode corresponding to each of the light emitting cells are respectively arranged adjacent to opposite corners in a diagonal direction and are symmetrical to those of light emitting cells adjacent to the one of the at least three light emitting cells.

2. The LED of claim 1, wherein the first electrode and the second electrode of a first light emitting cell are symmetrical to those of a second light emitting cell adjacent thereto.

3. The LED of claim 2, wherein the first electrode of the first light emitting cell is connected to the second electrode of the second light emitting cell.

4. The LED of claim 1, wherein the at least two light emitting cells are connected to each other in series.

5. The LED of claim 4, further comprising:
    an additional light emitting cell, wherein the additional light emitting cell is configured to connect the at least two of the at least three light emitting cells in series or the additional light emitting cell is configured to connect the at least one of the at least three light emitting cells in series.

6. The LED of claim 5, wherein the first electrode and the second electrode of each of the light emitting cells are opposite to each other with respect to one of the light emitting cells connected to one another in series.

7. The LED of claim 5, wherein the light emitting cells are connected to one another in series, and arrangement of the first electrode and the second electrode between two adjacent light emitting cells is the same as that between two light emitting cells opposite to the two adjacent light emitting cells.

8. The LED of claim 1, further comprising:
    a transparent electrode layer interposed between the second conductive semiconductor layer and the second electrode.

9. A light emitting diode (LED) comprising:
    a substrate;
    a plurality of light emitting cells on the substrate; and
    first connecting elements disposed on the substrate and connecting at least two light emitting cell arrays of the plurality of light emitting cells to one another in series,
    wherein the at least two light emitting cell arrays connected by the first connecting elements are configured to operate in response to a forward voltage and a reverse voltage by an Alternating Current (AC) power source,
    second connecting elements connecting one light emitting cell array to the other light emitting cell array of the at least two light emitting cell arrays to operate in response to a forward voltage to other light emitting cell array which configured to operate in response to a reverse voltage, wherein an overvoltage is prevented from being applied to the one or the other light emitting cell array in a light emitting cell array group to which the reverse voltage is applied, by the second connecting elements, during an operation by the forward voltage, and
    wherein each of the light emitting cells comprises a lower semiconductor layer comprising a first compound semiconductor layer, an upper semiconductor layer comprising a second compound semiconductor layer formed on the lower semiconductor layer, an active layer interposed between the lower semiconductor layer and the upper semiconductor layer, a lower electrode formed on an exposed portion of the lower semiconductor layer, a transparent electrode layer formed on the upper semiconductor layer, and an upper electrode formed on the transparent electrode layer, the upper electrode and the lower electrode being respectively arranged adjacent to opposite corners in a diagonal direction and are symmetrical to those of light emitting cells adjacent to the one of the at least two light emitting cells.

* * * * *